(12) United States Patent
Song et al.

(10) Patent No.: US 9,331,222 B2
(45) Date of Patent: May 3, 2016

(54) PHOTOVOLTAIC DEVICE

(71) Applicants: BOE Technology Group Co., Ltd., Beijing (CN); Beijing BOE Energy Technology Co., Ltd., Beijing (CN)

(72) Inventors: Hangbin Song, Beijing (CN); Peihuan Yang, Beijing (CN)

(73) Assignees: BOE TECHNOLOGY GROUP CO., LTD., Beijing (CN); BEIJING BOE ENERGY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 13/976,639

(22) PCT Filed: Dec. 5, 2012

(86) PCT No.: PCT/CN2012/085892
§ 371 (c)(1),
(2) Date: Jun. 27, 2013

(87) PCT Pub. No.: WO2013/139142
PCT Pub. Date: Sep. 26, 2013

(65) Prior Publication Data
US 2014/0083488 A1    Mar. 27, 2014

(30) Foreign Application Priority Data
Mar. 23, 2012 (CN) .......................... 2012 1 0080762

(51) Int. Cl.
*H01L 31/042* (2014.01)
*F24J 2/46* (2006.01)
(Continued)

(52) U.S. Cl.
CPC .......... *H01L 31/0422* (2013.01); *F24J 2/4627* (2013.01); *F24J 2/4638* (2013.01);
(Continued)

(58) Field of Classification Search
CPC  Y02B 10/12; H01L 31/0482; H01L 31/0484; H01L 31/0422–31/0424; Y02E 10/47; Y02E 10/50; F24J 2/4638; F24J 2/52–2/5203; F24J 2002/5213–2002/5226; F24J 2/523–2/5239; F24J 2002/5292; F24J 2/4627–2/4629; H02S 20/00; H02S 20/24
USPC .................................................. 136/243–265
See application file for complete search history.

(56) References Cited

U.S. PATENT DOCUMENTS 5,505,788 A * 4/1996 Dinwoodie .................... 136/246
6,809,251 B2 * 10/2004 Dinwoodie .................... 136/251
(Continued)

FOREIGN PATENT DOCUMENTS

CN    201435695 Y    3/2010
CN    201556632 U    8/2010
(Continued)

OTHER PUBLICATIONS

Second Office Action issued by the Chinese Patent Office for Chinese Patent Application No. 201210080762.8 dated Aug. 11, 2014, 4pgs.
(Continued)

*Primary Examiner* — James Lin
*Assistant Examiner* — Liesl C Baumann

(57) ABSTRACT

A photovoltaic device comprising: a base (1), a photovoltaic assembly (8) and a baffle plate (5), wherein the photovoltaic assembly is arranged in an inclined manner on the base from bottom up in a direction from front to rear, and behind the photovoltaic assembly, the baffle plate is arranged in an inclined manner on the base from bottom up in a direction from rear to front. The baffle plate reduces the profile coefficient and decreases the uplift by the action of wind load.

9 Claims, 5 Drawing Sheets

(51) Int. Cl.
*H02S 20/24* (2014.01)
*F24J 2/52* (2006.01)

(52) U.S. Cl.
CPC .............. *F24J 2/5233* (2013.01); *H02S 20/00* (2013.01); *H02S 20/24* (2014.12); *F24J 2/5203* (2013.01); *F24J 2002/5292* (2013.01); *Y02E 10/47* (2013.01); *Y02E 10/50* (2013.01)

(56) References Cited

U.S. PATENT DOCUMENTS

| | | | | |
|---|---|---|---|---|
| 2004/0250491 | A1* | 12/2004 | Diaz et al. | 52/518 |
| 2005/0126621 | A1* | 6/2005 | Dinwoodie et al. | 136/251 |
| 2007/0144575 | A1* | 6/2007 | Mascolo et al. | 136/246 |
| 2007/0151594 | A1* | 7/2007 | Mascolo et al. | 136/245 |
| 2009/0242014 | A1* | 10/2009 | Leary | 136/251 |
| 2009/0266406 | A1* | 10/2009 | Duke et al. | 136/251 |
| 2009/0320904 | A1* | 12/2009 | Botkin et al. | 136/251 |
| 2009/0320906 | A1* | 12/2009 | Botkin et al. | 136/251 |
| 2009/0320907 | A1* | 12/2009 | Botkin et al. | 136/251 |
| 2009/0320908 | A1* | 12/2009 | Botkin et al. | 136/251 |
| 2010/0116324 | A1* | 5/2010 | O'Brien et al. | 136/251 |
| 2010/0212714 | A1* | 8/2010 | Rothschild et al. | 136/244 |
| 2010/0243023 | A1* | 9/2010 | Patton et al. | 136/244 |
| 2011/0083381 | A1* | 4/2011 | David et al. | 52/173.3 |
| 2011/0108083 | A1* | 5/2011 | Ravestein et al. | 136/244 |
| 2012/0186632 | A1* | 7/2012 | Reinhold et al. | 136/251 |
| 2012/0199180 | A1* | 8/2012 | Salam | 136/251 |
| 2012/0234310 | A1* | 9/2012 | Wallgren | 126/571 |
| 2012/0266944 | A1* | 10/2012 | Wildes | F24J 2/5237 136/251 |
| 2012/0273029 | A1* | 11/2012 | Bragagna et al. | 136/251 |
| 2012/0312355 | A1* | 12/2012 | Patton et al. | 136/251 |
| 2012/0325294 | A1 | 12/2012 | Botkin et al. | |
| 2013/0015303 | A1* | 1/2013 | Gies et al. | 248/176.1 |
| 2013/0032208 | A1* | 2/2013 | Walz et al. | 136/259 |
| 2013/0111713 | A1* | 5/2013 | McPheeters | 24/569 |
| 2013/0112248 | A1* | 5/2013 | McPheeters | 136/251 |

FOREIGN PATENT DOCUMENTS

| | | |
|---|---|---|
| CN | 102077632 A | 5/2011 |
| CN | 202143002 U | 2/2012 |
| CN | 102655382 A | 9/2012 |

OTHER PUBLICATIONS

English translation of Second Office Action issued by the Chinese Patent Office for Chinese Patent Application No. 201210080762.8 dated Aug. 11, 2014, 3pgs.

International Preliminary Report on Patentability for International Application No. PCT/CN2012/085892 dated Sep. 23, 2014, 8pgs.

Third Office Action issued by the Chinese Patent Office for Chinese Patent Application No. 201210080762.8 dated Dec. 23, 4pgs.

English translation of Third Office Action issued by the Chinese Patent Office for Chinese Patent Application Na 201210080762.8 dated Dec. 23, 2014, 3pgs.

English translation of Chinese patent CN 102655382 (A), listed above, 10 pages, Sep. 5, 2012.

English translation of Chinese patent CN 201556632 (U), listed above, 5 pages, Aug. 18, 2010.

English translation of Chinese patent CN 102077632 (A), listed above, 20 pages, May 25, 2011.

English translation of Chinese publication CN 201435695Y, listed above, 7 pages, Mar. 31, 2010.

English abstract of Chinese patent CN 202143002 (U), listed above, 1 page, Feb. 8, 2012.

English translation of Chinese patent CN 202143002 (U), listed above, 6 pages, Feb. 8, 2012.

Office Action (in Chinese language) issued by the State Intellectual Property Office ("SIPO") on Mar. 5, 2014 for Chinese patent application No. 201210080762.8, 4 pages.

English translation of Office Action issued by the State Intellectual Property Office ("SIPO"), on Mar. 5, 2014, listed above, 3 pages.

International Search Report (Chinese language) issued by the International Searching Authority on Feb. 28, 2013, 13 pages.

\* cited by examiner

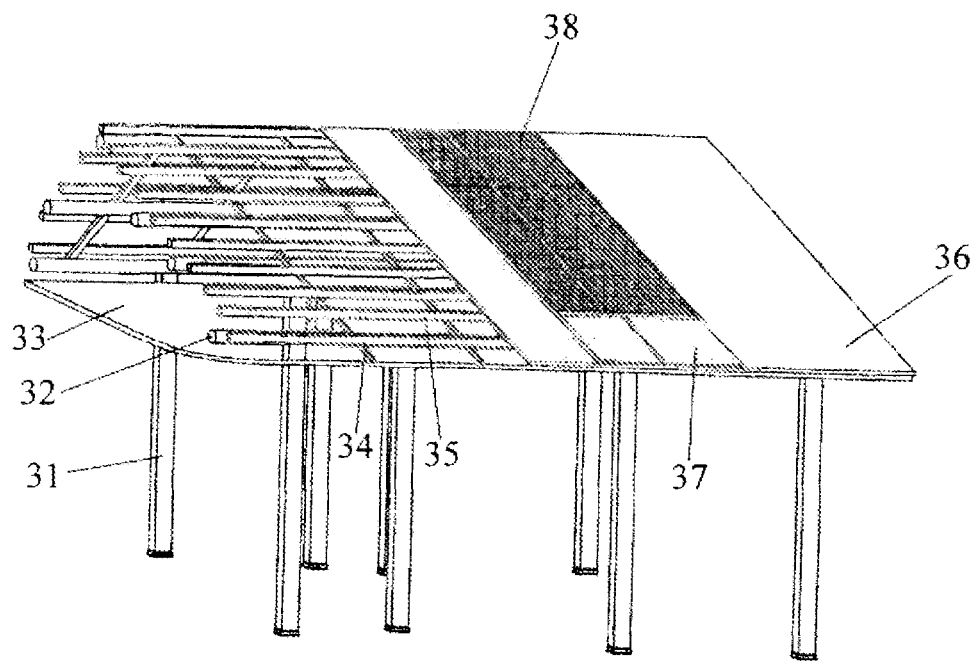
FIG. 1 - PRIOR ART
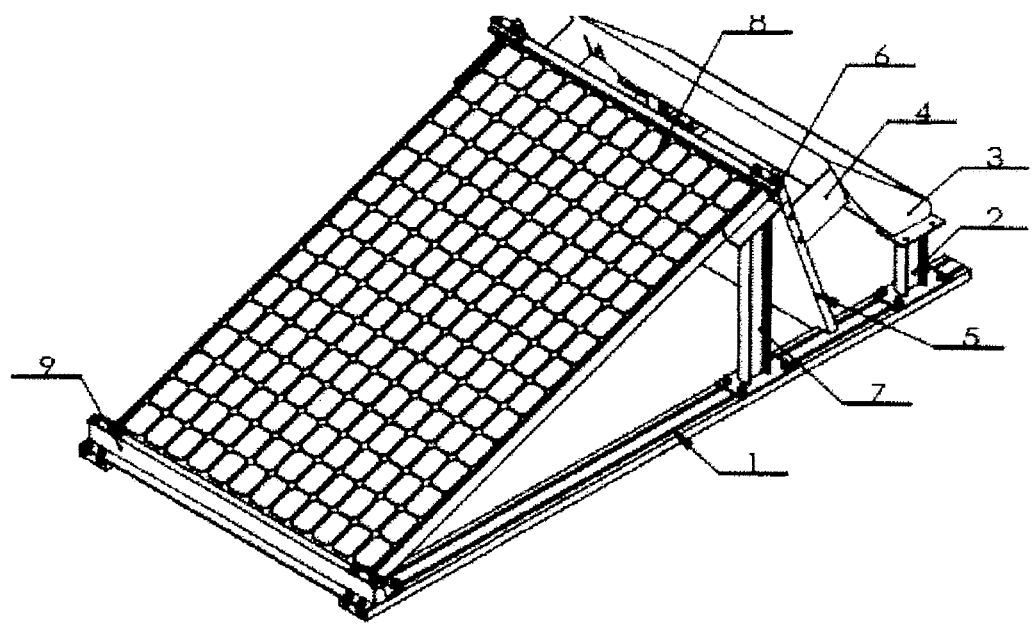
FIG. 2

US 9,331,222 B2

PHOTOVOLTAIC DEVICE

CROSS REFERENCE TO RELATED APPLICATIONS

This application is based on International Application No. PCT/CN2012/085892 filed on Dec. 5, 2012, which claims priority to Chinese National Application No. 201210080762.8, filed on Mar. 23, 2012, the contents of which are incorporated herein by reference.

TECHNICAL FIELD

Embodiments of the present invention relate to a photovoltaic device.

BACKGROUND

Building energy conservation and photovoltaic power generation are important development trends of modern construction industry. Accordingly, a building integrating photovoltaic is a new technique of great potential and significant value. A photovoltaic device for the roof of a building mainly comprises battery assemblies constructed by solar cells and carriers, and the battery assemblies are mounted on the part of the roof facing the sun. In the solar battery assemblies, light energy is converted into electrical energy which is gathered and input to an electrical grid. There are numbers of relatively mature technical solutions for gathering and inputting electrical energy to an electrical grid. The photovoltaic device generally has a structure, as shown in FIG. 1, comprising: pillars 31, beams 32 with dividing strip 34 and grilles 35 mounted thereon, and a ceiling 33; a house panel 36 is mounted on the grilles 35, a waterproof layer (or a felt layer) 37 is disposed on the house panel 36, tiles are covered on the waterproof layer 37, and battery assemblies 38 are mounted on the tiles. The above technique for the photovoltaic roof has disadvantages of: (1) complex structure, inconvenient mounting, great labor needs and difficulties in working on the roof; (2) large materials consumption, a large number of steps of materials processing and high labor costs; (3) non-durability, vulnerability, short life; (4) poor strength of connection between the roof and the battery assemblies and inconvenient maintenance and replacement; and (5) unfashionable and cumbersome appearance. In addition, connections and junctions in the existing roof are filled and sealed with bricks, cement, felt, glue, or the like, thus resulting in inconvenience in construction, poor performance in leakage and immersion prevention, and difficulties in maintenance.

Additionally, since the ordinary photovoltaic device mounted with battery assemblies is required to resist wind load for fifty year return period, a cement base is needed to be pre-constructed, which will damage the original roof; the repairing of the cement base and the roof waterproof layer will increase the cost of the photovoltaic system; in addition, errors occurring in both processing and fitting an existing holder will result in difficulties in mounting the holder. Moreover, the ordinary photovoltaic device has a great balance weight, thus requiring strong support for the roof.

SUMMARY

An embodiment of the invention provides a photovoltaic device comprising: a base, a photovoltaic assembly and a baffle plate, wherein the photovoltaic assembly is arranged in an inclined manner on the base from bottom up in a direction from front to rear, and behind the photovoltaic assembly, the baffle plate is arranged in an inclined manner on the base from bottom up in a direction from rear to front.

BRIEF DESCRIPTION OF THE DRAWINGS

In order to clearly illustrate the technical solution of the embodiment of the invention, the drawings of the embodiment will be briefly described in the following; it is obvious that the described drawings are only related to some embodiment of the invention and thus are not limitative of the invention.

FIG. 1 is a structure schematic diagram showing an existing photovoltaic device;
FIG. 2 is a perspective view showing a photovoltaic device in an embodiment of the invention.

REFERENCE SIGNS

1: base; 1-1: guide rail slotted hole; 2: spoiler rear support pillar; 3: spoiler; 3-1: upper surface; 3-2: lower surface; 3-3: windward side; 4: spoiler front support pillar; 5: baffle plate; 6: batten; 6-1: slotted hole in batten; 7: photovoltaic assembly rear support pillar; 8: photovoltaic assembly; 9: photovoltaic assembly front support pillar; 10: holding-down bolt for batten; 11: mounting bolt; 12: mounting nut; 13: mounting bolt for spoiler; 31: pillar; 32: beam; 33: ceiling; 34: dividing strip; 35: grille; 36: roof panel; 37: waterproof layer; 38: battery assembly.

DETAILED DESCRIPTION

One of the technical problems to be solved by an embodiment of the invention lies in improving the ability to resist wind load of a photovoltaic device while reducing difficulty in mounting the photovoltaic device.

In order to make objects, technical details and advantages of the embodiment of the invention apparent, the technical solutions of the embodiment will be described in a clearly and fully understandable way in connection with the drawings related to the embodiment of the invention. It is obvious that the described embodiment is just a part but not all of the embodiments of the invention. Based on the described embodiment herein, those skilled in the art can obtain other embodiment(s), without any inventive work, which should be within the scope of the invention.

Figure 3:
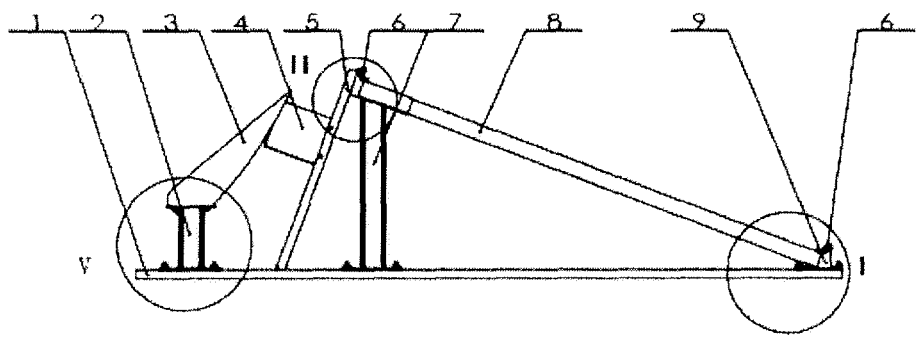
FIG. 3 is a side view showing the photovoltaic device in the embodiment of the invention.
Figure 4:
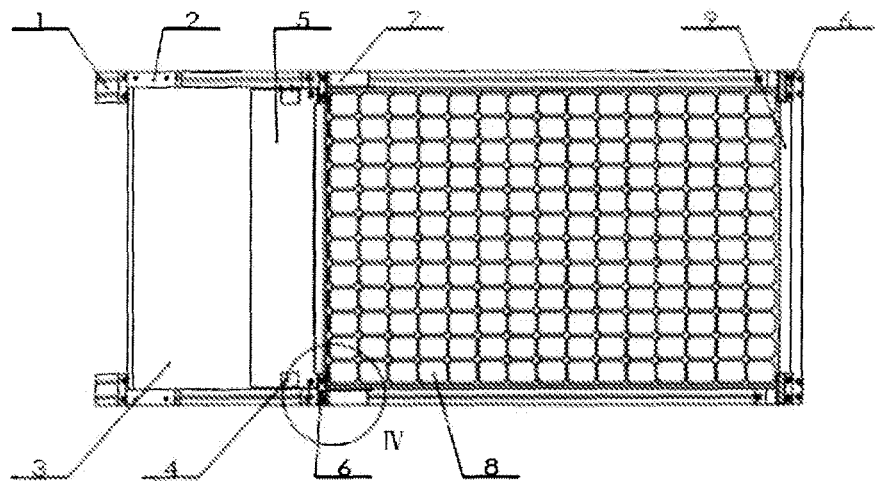
FIG. 4 is a top view showing the photovoltaic device in the embodiment of the invention.
Figure 5:
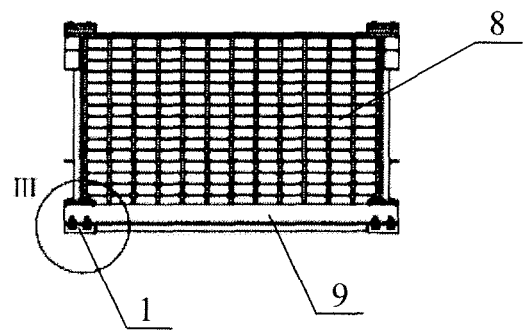
FIG. 5 is a front view showing the photovoltaic device in the embodiment of the invention.

FIG. 2 shows a perspective view of a photovoltaic device of an embodiment of the invention; FIG. 3 is its side view; FIG. 4 is its top view; and FIG. 5 is its front view. As shown in these figures, the photovoltaic device comprises a photovoltaic assembly 8 arranged on a base 1 and a baffle plate 5 provided on the rear side of the photovoltaic assembly 8. The photovoltaic assembly 8 is inclined upward in the direction from front to rear, while the baffle plate 5 is inclined upward in the direction from rear to front. The orientation words "upward", "downward", "front", "rear" and the like described hereinafter are all based on the description above.

In this embodiment, the base 1 comprises two base plates disposed side-by-side and spaced apart from each other. Each of the base plates is provided with a rail. The photovoltaic assembly 8 is mounted onto the rails so that the inclined angle of the photovoltaic assembly 8, which is generally within a range of 20~40°, can be adjusted. The upper end of the baffle plate 5 may be interfaced with the upper end of the photovoltaic assembly 8 or be fixed on a photovoltaic assembly rear support pillar 7. When the baffle plate 5 is interfaced with the photovoltaic assembly 8, the connection manner may be hinge connection, lap joint or butt connection, and preferably hinge connection. The lower end of the baffle plate 5 is mounted on the rails. The inclined angle of the baffle plate 5 is generally selected between 30~60°. Behind the baffle plate 5, there is provided a spoiler 3 which is configured in an inclined manner from the bottom up in the direction from rear to front, the upper end of which is interfaced with the baffle plate 5 or close to the upper end of baffle plate 5, and the lower end of which is fixed on the base 1, thereby realizing the incline of the spoiler 3.

The inclined arrangement of photovoltaic assembly 8 may be obtained, for example, by providing a photovoltaic assembly front support pillar 9 and the photovoltaic assembly rear support pillar 7 on the rails. The height of the photovoltaic assembly front support pillar 9 is less than that of the photovoltaic assembly rear support pillar 7, and the photovoltaic assembly front support pillar 9 and photovoltaic assembly rear support pillar 7 support and mount the lower end and the upper end of the photovoltaic assembly 8 respectively; the lower end of the baffle plate 5 is fixed onto the rails, and the upper end of the baffle plate 5 is fixed onto the upper end of the photovoltaic assembly rear support pillar 7, thereby realizing inclined arrangement of the baffle plate 5; the inclined arrangement of the spoiler 3 is obtained, for example, by providing a spoiler rear support pillar 2 on the rails behind the baffle plate 5, providing a spoiler front support pillar 4 on the baffle plate 5, mounting the lower end and the upper end of the spoiler 3 on the spoiler rear support pillar 2 and the spoiler front support pillar 4 respectively, so as to make the spoiler 3 arranged in an inclined manner to the rear side of the baffle plate 5.

In the present embodiment, the number of the rails provided on the base I may be increased reasonably according to the size and weight of the photovoltaic assembly 8; moreover, the lengths of the rails are determined according to the length of the entire structure of the photovoltaic assembly front support pillar 9, the photovoltaic assembly rear support pillar 7, the baffle plate 5, and the spoiler 3.

Since the photovoltaic assembly 8 is inclined from the photovoltaic assembly rear support pillar 7 toward the photovoltaic assembly front support pillar 9, the acting force exerting on the photovoltaic assembly front support pillar 9 is greater than that exerting on the photovoltaic assembly rear support pillar 7. Thus, for example, the photovoltaic assembly front support pillar 9 is provided as a plate-like structure, and the photovoltaic assembly rear support pillar 7 is provided in an individual pillar-like support fixed on the rails.

Since the photovoltaic assembly rear support pillar 7 has a relatively great height, both the upper ends of the left and right sides of the baffle plate 5 are fixed onto upper end of the photovoltaic assembly rear support pillar 7. With the baffle plate, the wind load of the profile of the photovoltaic device changes, according to the following wind load calculating equation:

$$\omega_k = \beta_z * \mu_s * \mu_z * \omega_0$$

where $\omega_k$ is a standard value for wind load, in unit $kN/m^2$; $\beta_z$ is a wind vibration coefficient at a height z; $\mu_s$ is a wind load profile coefficient; $\mu_z$ is a wind pressure height change coefficient; $\omega_0$ is a basic wind pressure value, in unit $kN/m^2$. According to the calculating equation of the wind load profile coefficient, the wind load profile coefficient $\mu_s$ here is increased correspondingly and the wind suction is decreased correspondingly, so as to enhance the capacity of bearing the wind load of the photovoltaic device in the present embodiment.

Figure 6:
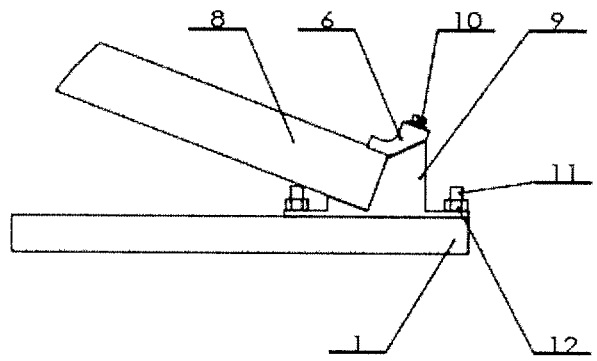
FIG. 6 is a partial enlarged view of the area I in FIG. 3.
Figure 8:
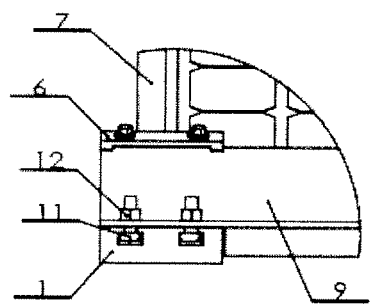
FIG. 8 is a partial enlarged view of the area III in FIG. 5.
Figure 11:
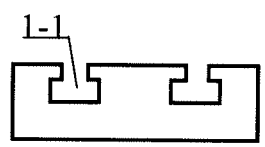
FIG. 11 is a schematic cross sectional view showing a guide rail in the embodiment of the invention.

In the present embodiment, the photovoltaic assembly front support pillar 9 and the photovoltaic assembly rear support pillar 7 are mounted on the rails respectively with nuts. With reference to FIG. 3, the photovoltaic assembly rear support pillar 7 is fixed on the rails with nuts. With reference to FIG. 6 and FIG. 8, the photovoltaic assembly front support pillar 9 is fixed onto the rail by mounting bolts 11 and mounting nuts 12. The form of the cross sectional of the rail is as shown in FIG. 11, which uses an aluminum alloy material and is subjected to an antiseptic treatment. A guide rail slotted hole 1-1 is provided in each of the rails, for the nut sliding inside, in order to adjust the mounting positions of the photovoltaic assembly front support pillar 9 and the photovoltaic assembly rear support pillar 7 on the rail to avoid the mounting difficulty brought by processing error, and at the same time to adjust the inclined angle of the photovoltaic assembly.

Figure 7:
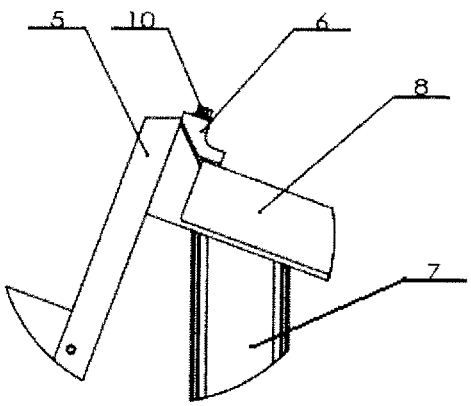
FIG. 7 is a partial enlarged view of the area II in FIG. 3.

In order to enhance the support fastness of the support pillar for the photovoltaic assembly 8 in the present embodiment, the photovoltaic assembly front support pillar 9 uses aluminum alloy section bar of a special shape, the shape of the cross section of which is as shown in FIG. 6, i.e., the side on the photovoltaic assembly front support pillar 9 facing the photovoltaic assembly rear support pillar 7 is provided with a open slot, the shape and size of which match those of the photovoltaic assembly 8 contacting with the pillar 9, such that an end of the photovoltaic assembly 8 can be snapped fitly within the open slot of the photovoltaic assembly front support pillar 9. Also, as shown in FIG. 7, the side on the photovoltaic assembly rear support pillar 7 facing the photovoltaic assembly front support pillar 9 is also provided with an open slot, the shape and size of which match those of the photovoltaic assembly 8 contacting with the pillar 7, such that the other end of the photovoltaic assembly 8 can be fitly snapped within the open slot of the photovoltaic assembly rear support pillar 7. In order to make the photovoltaic assembly 8 snapping on the photovoltaic assembly front pillar 9 and the photovoltaic assembly rear support pillar 7 more firmly, battens 6 are provided on the photovoltaic assembly front support pillar 9 and the photovoltaic assembly rear support pillar 7, with the battens 6 being situated on the two ends of the photovoltaic assembly 8 for pressing the photovoltaic assembly 8.

Figure 13:
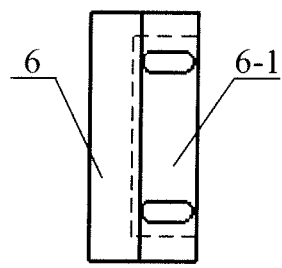
FIG. 13 is a top view showing a batten in an embodiment of the invention.

In the present embodiment, the connection plane of the battens 6 to the photovoltaic assembly front support pillar 9 and the photovoltaic assembly rear support pillar 7 are all inclined planes, and the ends of the inclined planes of batten 6 contacting with the photovoltaic assembly 8 have projections, compatible with the inclined arrangement of photovoltaic assembly 8, to press both the two ends of the photovoltaic assembly 8. Threaded holes are provided on the photovoltaic assembly front support pillar 9 and the photovoltaic assembly rear support pillar 7, batten groove shaped holes 6-1 are provided on the sides of both the battens 6 contacting with the photovoltaic assembly front support pillar 9 and the photovoltaic assembly rear support pillar 7, as shown in FIG. 13, the provision of the batten groove shaped holes 6-1 enables that the positions of the battens 6 on the photovoltaic assembly front support pillar 9 and the photovoltaic assembly rear support pillar 7 can be adjusted. For example, the batten push nuts 10 are used to pass through the batten groove shaped holes 6-1 and into the threaded holes of corresponding positions of on the photovoltaic assembly front support pillar 9 or the photovoltaic assembly rear support pillar 7, and the left and right positions of the batten 6 may be adjusted by adjusting the nuts 10.

In the present embodiment, the lower end of the baffle plate 5 is fixed onto the rails with nuts, and the upper end is fixed onto the photovoltaic assembly rear support pillar 7 with nuts.

Figure 10:
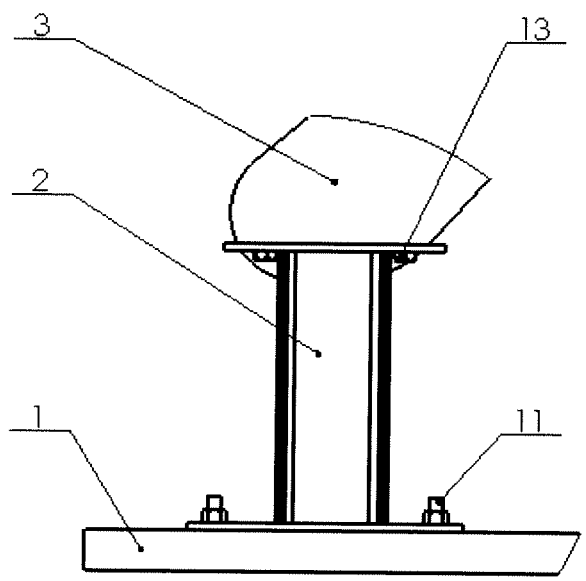
FIG. 10 is a partial enlarged view of the area V in FIG. 3.
Figure 12:
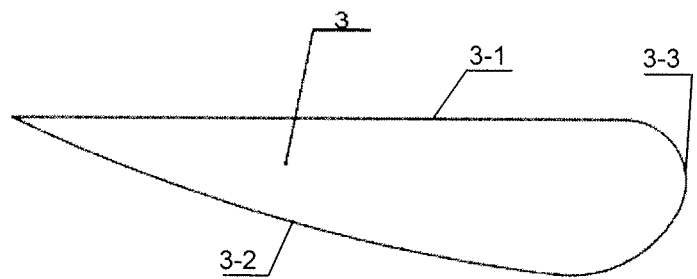
FIG. 12 is a schematic cross sectional view showing a spoiler in the embodiment of the invention.

In the present embodiment, the spoiler 3 can be designed with reference to a tail of a sports car, such that the lift force is reduced when the wind speed is great. It can be known according to the Bernoulli Equation in fluid mechanics, during the flow of fluid, pressure is associated with flow rate, and lower pressure occurs at a location having high flow rate. According to the principle of mass conservation, the spoiler 3 is designed as shown in FIG. 12, the surface of which at the opposed side to the baffle plate 5 is referred to as upper surface 3-1, which is a plane, the surface of the spoiler 3 facing the baffle plate 5 is referred to as lower surface 3-2, and the lower surface 3-2 and the windward side 3-3 are cambered surfaces. When the spoiler 3 is mounted, the bottom of the windward side 3-3 is provided with a mounting slot (not shown), the lower end of the spoiler 3 is mounted on the spoiler rear support pillar 2 with the mounting slot; the upper end of the spoiler 3 is connected with the baffle plate 5 with the spoiler front support pillar 4, and the spoiler front support pillar 4 is higher than the spoiler rear support pillar 2. As shown in FIG. 10, the provision of the mounting slot facilitates to place the spoiler 3 on the spoiler rear support pillar 2, the mounting slot has threaded holes inside, and the spoiler 3 is fixed on the spoiler rear support pillar 2 with spoiler mounting bolts 13. The structure provision and mounting manner of the spoiler 3 cause the airflow rate increase and the pressure decrease around the lower surface 3-2, such that the spoiler 3 creates wind pressure; the greater the wind speed, the lower the wind pressure. For example, the spoiler rear support pillar 2 is an I-steel weld, the lower part of which is perforated steel plate, which is connected to the rails with bolts and nuts and may slide left and right to adjust the position facilitating the assembly of the entire holder.

Figure 14:
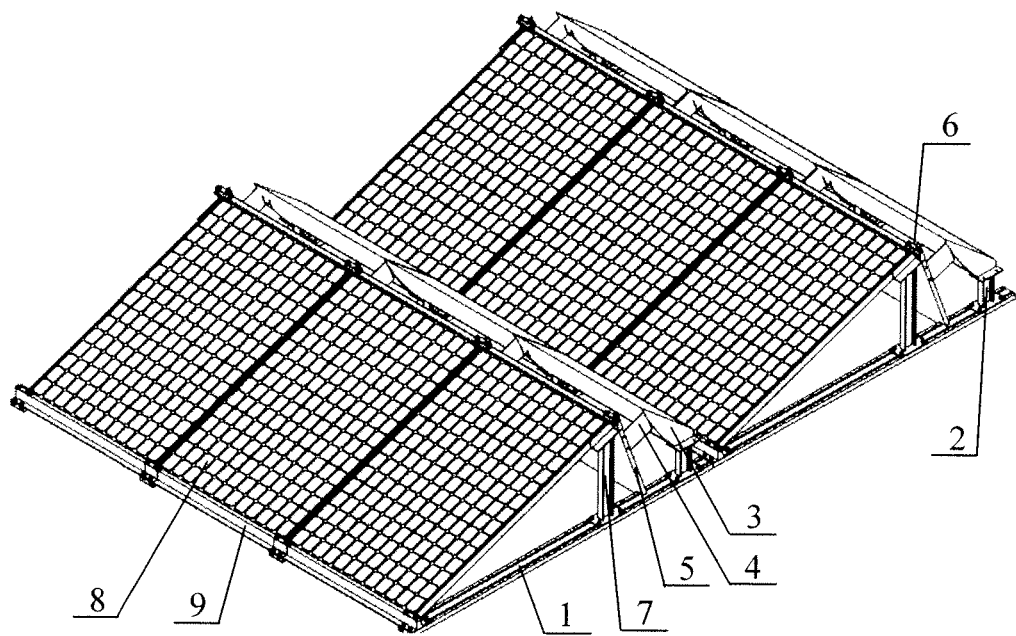
FIG. 14 is a perspective view showing an array-type photovoltaic device provided by an embodiment of the invention.

The support structure for supporting one set of photovoltaic assembly 8 is referred to as one set of holder unit. It is usually to need a plurality of sets of holder unit to support a plurality of sets of photovoltaic assembly 8 so as to construct a photovoltaic device of array-type according to actual projection requirement. As shown in FIG. 14, when there are sets of holder unit along the length direction of the rail, the length of the rail is increased in multiple with the increased number of the holder units and the other assemblies of the holder units can be provided correspondingly. Now sets of holder units are provided on the rails in sequence, and one photovoltaic assembly 8 are mounted on each set of the holder units to form the photovoltaic device of array-type.

Figure 9:
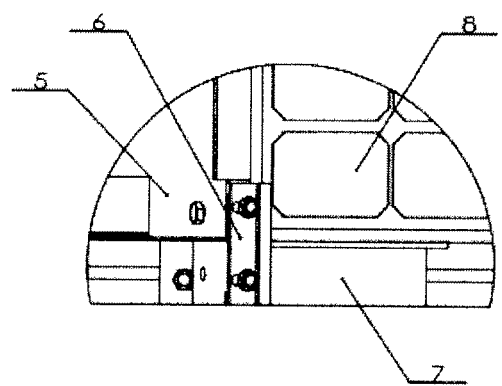
FIG. 9 is a partial enlarged view of the area IV in FIG. 4.

When there are sets of holder units along the direction perpendicular to the rail length, the number of the rails provided spaced from each other and in parallel is increased, the adjoining several rails are constructed as the base of a set of the holder units, other support assemblies are mounted on it to construct sets of parallel holder units, and after the photovoltaic assemblies 8 are mounted, the photovoltaic device of array-type is formed. In the photovoltaic device of array-type, when the photovoltaic assemblies 8 are arranged transversely, each photovoltaic assembly rear support pillar 7 situated in the middle of the array may support two sets of adjoining photovoltaic assemblies 8 at the same time, and at this time the open slot of the upper part of the photovoltaic assembly rear support pillar 7 may be expanded based on the position and size in a single holder unit structure correspondingly. As shown in FIG. 7 and FIG. 9, the width of the open slot is increased, which can support the photovoltaic assembly 8 at both the left and right sides at the same time. In this way, the materials can be saved, and further the close arrangement of the photovoltaic assembly array-type can be obtained.

It can be seen from the above embodiment, the embodiment of the invention reduces the profile coefficient and decreases the uplift by the action of wind load by designing the baffle plate, changes the airflow rate and creates downward pressure by designing a spoiler, which can have an effect of increasing weight and reduce the uplift and offset force under the action of wind load, makes the mounting of the baffle plate, spoiler and the photovoltaic assembly supported convenient and firm by designing a base constituted with rails, can facilitate to constitute an integration of array-type to make the photovoltaic device more firm, and makes photovoltaic assembly to compensate a longitudinal gap during clamping so as to prevent the assembly from sliding out by designing a sandwiched structure constructed with the front, rear support pillar and batten.

According to the above description, at least the following structure and method can be provided according to the embodiment of the invention:

(1) a photovoltaic device comprising: a base, a photovoltaic assembly and a baffle plate, wherein the photovoltaic assembly is arranged in an inclined manner on the base from bottom up in a direction from front to rear, and behind the photovoltaic assembly, the baffle plate is arranged in an inclined manner on the base from bottom up in a direction from rear to front.

(2) The photovoltaic device according to (1), wherein an upper end of the baffle plate is interfaced with an upper end of the photovoltaic assembly.

(3) The photovoltaic device according to (1) or (2), further comprises a spoiler which is arranged in an inclined manner behind the baffle plate from bottom up in the direction from rear to front.

(4) The photovoltaic device according to (3), wherein a lower end of the spoiler is fixed onto the base.

(5) The photovoltaic device according to any one of (1) to (4), wherein a photovoltaic assembly front support pillar and a photovoltaic assembly rear support pillar are provided on the base for respectively supporting a lower end and an upper end of the photovoltaic assembly.

(6) The photovoltaic device according to (5), wherein the upper end of the baffle plate is fixed onto the photovoltaic assembly rear support pillar.

(7) The photovoltaic device according to (6), wherein a spoiler front support pillar is provided on the base, which supports the lower end of the spoiler; and a spoiler rear support pillar is provided on the baffle plate, which supports the upper end of spoiler.

(8) The photovoltaic device according to (7), wherein the base comprises at least two base plates provided spaced from each other and in parallel, on which are provided with rails; and the photovoltaic assembly front support pillar, the photovoltaic assembly rear support pillar, and the spoiler front support pillar are mounted on the rails respectively.

(9) The photovoltaic device according to (5), wherein open slots are provided on the photovoltaic assembly front support pillar and the photovoltaic assembly rear support pillar, with an end of the photovoltaic assembly being inserted into the open slot.

In the photovoltaic device according to an embodiment of the present application, the profile coefficient is reduced and the uplift by the action of wind load is decreased with provision of the baffle plate; the airflow rate is changed and a downward pressure is created with provision of a spoiler, and the spoiler can have an effect of increasing weight which reduces the uplift and offset force under the action of the wind load; the mounting of the baffle plate, spoiler and the photovoltaic assembly supported is convenient and firm with provision of a base constituted with rails, and can facilitate to constitute a integration of array-type to make the photovoltaic device more firm.

Although the invention has been described in detail using general illustration and concrete implementation, certain modifications and improvements to it may be made based on the invention, which is obvious for those skilled in the art. Therefore, all the modifications and improvements based on the spirit of the invention belong to the protection scope of the invention.

The invention claimed is:

1. A photovoltaic device comprising: a base, a photovoltaic assembly and a baffle plate, wherein the photovoltaic assembly is arranged in an inclined manner on the base from bottom up in a direction from front to rear, and completely behind the photovoltaic assembly, the baffle plate is arranged in an inclined manner on the base from top downwards in the direction from front to rear; and further comprising a spoiler which is arranged in an inclined manner completely behind the baffle plate from top downwards in the direction from front to rear, wherein a lower end of the spoiler is fixed onto the base, wherein a surface of the spoiler facing the baffle plate and a windward side of the spoiler are formed integrally and are cambered surfaces, and a surface of the spoiler at the opposed side to the baffle plate is a plane, wherein the baffle plate is positioned between the photovoltaic assembly and the spoiler, and wherein the baffle plate extends the entire length from an upper end of the photovoltaic assembly to the base.

2. The photovoltaic device according to claim 1, wherein an upper end of the baffle plate is interfaced with the upper end of the photovoltaic assembly.

3. The photovoltaic device according to claim 2, wherein a photovoltaic assembly front support pillar and a photovoltaic assembly rear support pillar are provided on the base, for respectively supporting a lower end and the upper end of the photovoltaic assembly.

4. The photovoltaic device according to claim 1, wherein a photovoltaic assembly front support pillar and a photovoltaic assembly rear support pillar are provided on the base, for respectively supporting a lower end and the upper end of the photovoltaic assembly.

5. The photovoltaic device according to claim 4, wherein an upper end of the baffle plate is fixed onto the photovoltaic assembly rear support pillar.

6. The photovoltaic device according to claim 5, wherein a spoiler front support pillar is provided on the base, which supports the lower end of the spoiler; and a spoiler rear support pillar is provided on the baffle plate, which supports an upper end of the spoiler.

7. The photovoltaic device according to claim 6, wherein the base comprises at least two base plates provided spaced from each other and in parallel, on which are provided with rails; and the photovoltaic assembly front support pillar, the photovoltaic assembly rear support pillar, and the spoiler front support pillar are mounted on the rails respectively.

8. The photovoltaic device according to claim 4, wherein a first open slot is provided on the photovoltaic assembly front support pillar and a second open slot is provided on the photovoltaic assembly rear support pillar, with one end of the photovoltaic assembly being inserted into the first open slot of the photovoltaic assembly front support pillar and the other end of the photovoltaic assembly being inserted into the second open slot of the photovoltaic assembly rear support pillar.

9. The photovoltaic device according to claim 1, wherein the spoiler is supported on the baffle plate.

* * * * *